(12) United States Patent
Nordal et al.

(10) Patent No.: US 7,211,885 B2
(45) Date of Patent: May 1, 2007

(54) VERTICAL ELECTRICAL INTERCONNECTIONS IN A STACK

(75) Inventors: Per-Erik Nordal, Asker (NO); Hans Gude Gudesen, Brussels (BE); Geirr Ivarsson Leidstad, Sandvika (NO); Göran Gustafsson, Linköping (SE); Johan Carlsson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/390,178

(22) Filed: Mar. 14, 2003

(65) Prior Publication Data
US 2003/0218191 A1 Nov. 27, 2003

Related U.S. Application Data

(63) Continuation of application No. PCT/NO01/00113, filed on Mar. 15, 2001.

(30) Foreign Application Priority Data
Mar. 15, 2000 (NO) .................................. 20001360

(51) Int. Cl.
*H01L 23/02* (2006.01)
(52) U.S. Cl. ...................... 257/686; 257/723; 257/777; 257/786
(58) Field of Classification Search ................ 257/685, 257/686, 723, 777, 789, 773, 786, 689, 774, 257/784
See application file for complete search history.

(56) References Cited

U.S. PATENT DOCUMENTS

| 5,093,708 A | 3/1992 | Solomon |
| 5,422,435 A * | 6/1995 | Takiar et al. ............... 174/52.4 |
| 5,502,289 A | 3/1996 | Takiar et al. |

(Continued)

FOREIGN PATENT DOCUMENTS

EP 0 522 518 1/1993

(Continued)

OTHER PUBLICATIONS

Patent Abstract of Japan, JP-58-178547 (Matsushita Denki Sangyo K. K.) Jan. 20, 1984, vol. 8, No. 13.

(Continued)

*Primary Examiner*—Hoai Pham
*Assistant Examiner*—Dilinh Nguyen
(74) *Attorney, Agent, or Firm*—Jacobson Holman PLLC

(57) ABSTRACT

In a memory and/or data processing device having at least two stacked layers which are supported by a substrate or forming a sandwiched self-supporting structure, wherein the layers include memory and/or processing circuitry with mutual connections between the layers and/or to circuitry in the substrate, the layers the are mutually arranged such that contiguous layers form a staggered structure on at least one edge of the device and at least one electrical edge conductor is provided passing over the edge on one layer and down one step at a time, enabling the connection to an electrical conductor in any of the following layers in the stack. A method for manufacturing a device of this kind includes the steps for adding the layers successively, one layer at a time, such that the layers form a staggered structure, and for providing one or more layers with at least one electrical contact pad for linking to one or more interlayer edge connectors.

9 Claims, 16 Drawing Sheets

U.S. PATENT DOCUMENTS

| | | |
|---|---|---|
| 6,004,825 A | 12/1999 | Seyyedy |
| 6,215,182 B1 * | 4/2001 | Ozawa et al. ............... 257/723 |
| 6,353,263 B1 * | 3/2002 | Dotta et al. ................. 257/777 |
| 6,376,904 B1 * | 4/2002 | Haba et al. ................. 257/686 |
| 6,621,155 B1 * | 9/2003 | Perino et al. ............... 257/686 |
| 6,664,639 B2 * | 12/2003 | Cleeves ..................... 257/774 |

OTHER PUBLICATIONS

A Review of 3-D Packaging Technology, IEEE Transactions on Components, Packaging, and Manufacturing Technology, Part B, vol. 21, No. 1, Feb. 198.

* cited by examiner

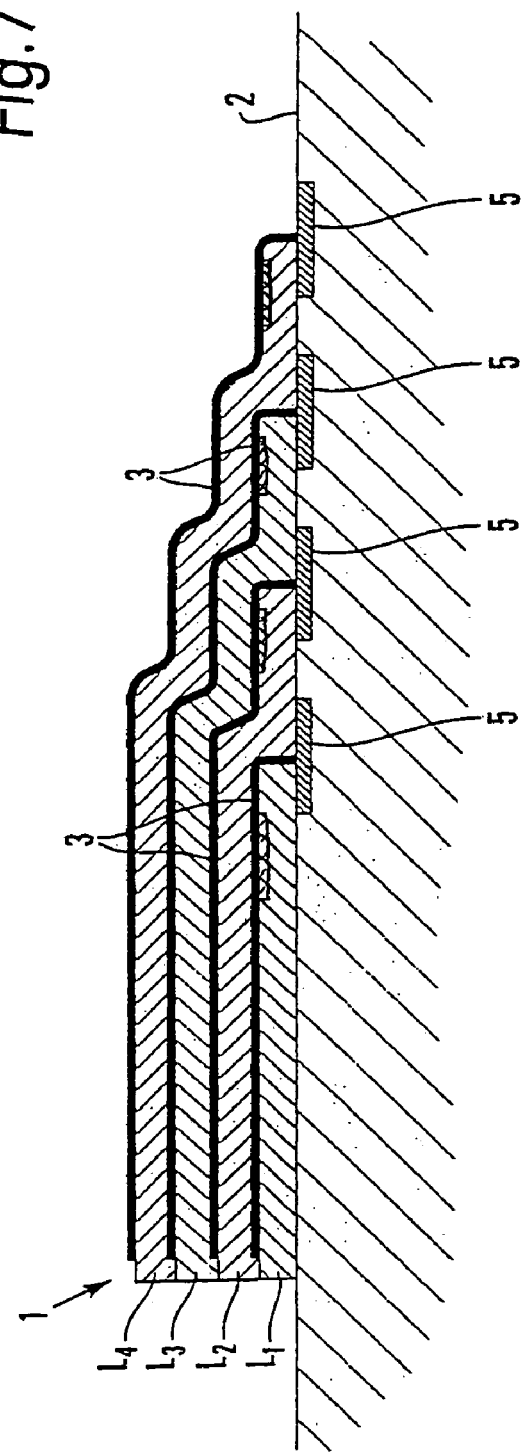

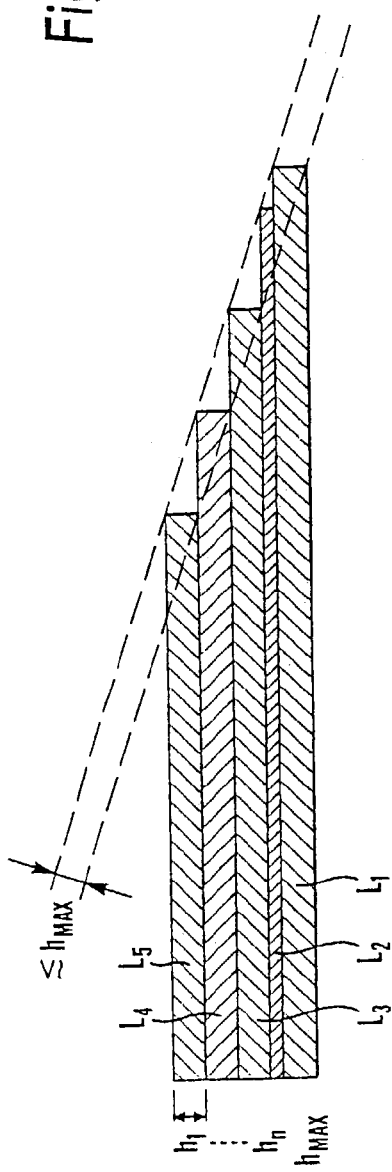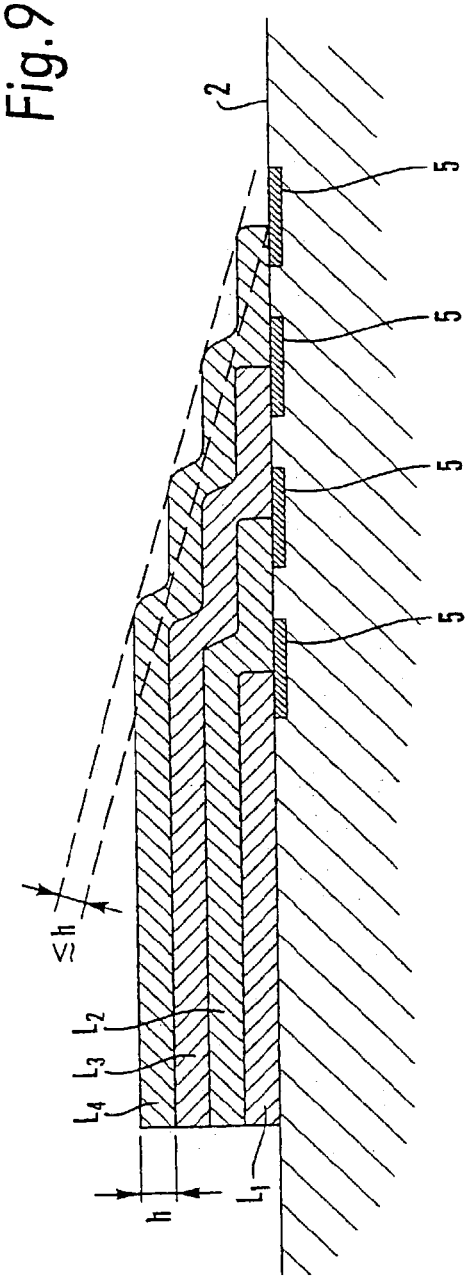

ELECTRODES (BIT LINES, LAYER 2)

MEMORY FILM, LAYER 2

ELECTRODES WORD LINES, LAYER 2 ns provided on each step in the staggered structure are formed by exposed portions of the separate layers in the stack and with a step height h corresponding to the thickness of the respective layers. It also concerns a method for fabrication of a memory and/or data processing device which comprises at least two layers provided in a stack, wherein the stack either forms a self-supporting structure or alternatively is provided on a substrate, and wherein the stack comprises at least one structure staggered in one direction, such that steps in the staggered structure are formed of exposed portions of the separate layers in the stack and with a step height h corresponding to thickness of the respective layers.

VERTICAL ELECTRICAL INTERCONNECTIONS IN A STACK

This is a Continuation Application of PCT International Application No. PCT/NO01/00113, filed Mar. 15, 2001.

FIELD OF THE INVENTION

The present invention concerns a memory and/or data processing device having at least two stacked layers provided in a stack, wherein the stack either forms a self-supporting structure or alternatively is provided on a substrate, and wherein the stack comprises at least one structure staggered in at least one direction, such that steps in the staggered structure are formed by exposed portions of the separate layers in the stack and with a step height h corresponding to the thickness of the respective layers. It also concerns a method for fabrication of a memory and/or data processing device which comprises at least two layers provided in a stack, wherein the stack either forms a self-supporting structure or alternatively is provided on a substrate, and wherein the stack comprises at least one structure staggered in one direction, such that steps in the staggered structure are formed of exposed portions of the separate layers in the stack and with a step height h corresponding to thickness of the respective layers.

BACKGROUND OF THE INVENTION

Modern electronic microcircuits are typically built layer by layer on silicon chips in a series of process steps where insulating layers separate layers containing metallic, insulating and semiconducting materials that are patterned and processed by various deposition and etching techniques. Integral to the ensuing architectures are electrical connections between components and sub-circuits which are located in the substrate and in layers on top of the substrate. These connections, termed vias, are typically in the form of metallic posts or wires that penetrate through one or more layers of intervening material separating the components to be connected. Such vias are either made during the layer-building process or they are inserted through already existing layers by creating channels through the layers (by e.g. etching), followed by filling metal plugs into the channels.

Silicon chips according to prior art may involve 20–30 masking steps, and the number of separate layers containing patterned metal intra-layer leads that connect directly or indirectly to a via is typically 3–5. Each via requires a certain amount of real estate associated with it in each layer that is traversed or connected. In addition to the metal cross section of the via itself, there must be allocated a buffer zone around it which insulates the via from adjacent circuitry that shall not be in immediate contact with the via, and allowance must be made for the finite precision with which the patterning in each layer can be made as well as registration accuracy of patterning masks.

In the paper "A review of 3-D Packaging Technology" by S. F. Al-sarawi, D. Abbott and P. D. Franzon, IEEE Transactions on components, packaging, and manufacturing technology, part B, volume 21, No. 1 (February 1998), there is given a survey of the state of the art with regard to three-dimensional packaging technology aimed at large scale integration. Herein there is in several places referred to how whole stacks of integrated circuit chips can be connected mutually electrically, among other with the use of vertical vias and current paths provided on the side surfaces of circuit chip stacks, as well as the use of bonding wires for connecting respectively the mother and daughter chip where the daughter chip is provided stacked upon the mother chip, such that the exposed surface of the mother chip form a step of the stack. In this case bonding wires which are mechanically connected to contact points on the chips are used.

Wholly generally there is besides in Norwegian patent No. 308 149 and in Norwegian patent application No. 19995975 disclosed memory and data processing devices where the separate layers in the stack substantially are made with sublayers of thin film in organic material and wherein conductors at the thin films in the separate layers are conveyed to electrical edge connections on the side of the layers. In Norwegian patent application No. 19995975 the connection between the layers may additionally also be formed by vias which in principle will be fabricated as conducting structures in the same material which is included in the thin film and hence form an integral part thereof, and there is further shown a concept called "staggered vias" wherein the separate layers in a stack of this kind are provided mutually staggered and the layers in the stack connected mutually electrically or to an underlying substrate by the use of so-called staggered vias over the staggered portion. Neither in Norwegian patent 308 149 nor in Norwegian patent application No. 19995975 there are given any directions how the disclosed edge connections can be realized in a physical and practical embodiment.

The above referred prior art has generally proved inadequate for devices built on silicon substrates as mentioned above, where the number of layers and vias is low to moderate, and where ultra-high precision lithography is an integral part of the chip-making process. However, vias represent a considerable complicating feature in the overall manufacturing process, with consequences for yield and costs. Furthermore, it is expected that entirely new types of device architectures and manufacturing methods for electronic data processing and storage devices shall emerge in the next few years as serious contenders for large commercial segments. A common feature of such new architectures shall be that they incorporate thin-film electronics in dense stacks containing very large numbers of layers. In many instances, these devices will be manufactured by high-volume technologies such as reel-to-reel processing on thin polymer substrates. In this context, traditional via connection technologies shall be totally inadequate, technically as well as cost-wise.

It is a major object of the present invention to provide methods and technical solutions whereby electrical interconnects can be created between layers and/or between layers and an underlying substrate, in memory and/or processing devices that incorporate a stack containing two or more sheet- or film-like functional parts that partially or completely overlap each other. It is also an object of the present invention to provide such methods and technical solutions that can be implemented in cases where the number of such sheet- or film-like functional parts becomes large, typically exceeding 5–10.

It is a further object of the present invention to provide such methods and technical solutions that can be implemented in cases where such sheet- or film-like functional parts are manufactured and devices assembled by high-volume, low-cost technologies.

The above-mentioned objects and further features and advantages are realized according to the present invention with a device which is characterized in that one or more contact pads are provided on each step in the staggered structure in electrical connection with memory and/or processing circuits in the respective layer, and that one or more electrical edge connections are provided on and over the step in each layer in the form of electrical conducting structures on the step and over the edge between the steps in each layer and deposited on the surface of the layers, the electrical edge connections contacting one or more contact pads in the layers and providing electrical connection between each layer and also between the layers and contact pads provided on an optional substrate.

In the device according to the invention it is considered advantageous that two or more contact pads in one or more layers are mutually connected by electrical conducting structures provided on the step in the respective layer. Further there is in the device according to the invention regarded as advantageous that the electrical edge connections are provided as continuous current paths between contact pads in at least three consecutive layers in the stack or between contact pads in at least two adjacent layers in at least two adjacent layers in the stack and an optional substrate adjacent to one of these layers and/or that the electrical edge connections are provided as a patched current path between two adjacent layers in the stack or between an optional substrate and the layer adjacent to the substrate.

Preferably the stack in the device according to the invention forms at least a part of a step pyramid structure, such that the layers have different areas.

In an advantageous embodiment of the device according to the invention the separate layers in the stack are mutually displaced, such that the staggered structure comprises at least one staggered portion where the steps form an exposed portion of an upper surface in the respective layers in the stack and at least one staggered portion where the steps form an exposed portion of a lower surface in the respective layers in the stack, one or more contact pads on each step in each case being electrically connected with conducting structures respectively provided on opposite surfaces of the layers.

In another advantageous embodiment of the device according to the invention, wherein the stack is provided on a substrate, the stack forms at least a part of an inverted step pyramid-like structure, such that the area of each layer increases with the distance from the substrate, and that overlying layers are carried over the edges of underlying layers and to rest against the substrate, overlying layers being formed with one or more staggered portions, whereby the number of steps in the staggered portion of a layer corresponds to the number of layers located therebeneath, and preferably are then one or more contact pads provided in the substrate where the layers are resting against the substrate.

Finally there is in the device according to the invention regarded as advantageous that the side edge of each layer between the steps is rounded or forms an inclined surface.

The above-mentioned objects and further features and advantages are also realized according to the invention with a method which is characterized by adding each layer in the stack in separate succeeding steps, providing each succeeding layer in the stack with an area different relative to the previous adjacent layer or displaced in relation thereto, such that the stack is formed with the at least one staggered structure in one direction, steps in the staggered structure being formed by exposed portions in the provided layers, depositing structures of conducting material on the steps in each layer, such that one or more current paths and one or more contact pads are formed on each layer, and depositing continuous and/or patched electrical conducting structures which form electrical edge connections between the contact pads on two or more layers and/or between the contact pads or one or more layers and the substrate.

In the method according to the invention it is regarded as advantageous depositing depositing the layers such that the stack forms at least a part of a step pyramid structure, or depositing the layers such that the stack forms at least a part of an inverted step pyramid structure, each overlying layer being deposited over the edge of an underlying layer and to rest against the substrate, whereby overlying layers are formed with one or more staggered portions, the number of steps in each staggered portion in a layer corresponding to the number of layers located therebeneath.

In the last-mentioned case one or more contact pads are preferably provided in the substrate where the layers rest against the substrate.

Finally there is in the method according to the present invention regarded as advantageous forming the electrical edge connections in a process selected among one of the following, viz. lithography, dry etching, ink jet printing, silk printing, soft lithography, electrolysis, electrostatic deposition or in situ conversion.

BRIEF DESCRIPTION OF THE DRAWINGS

In the following the invention will be described in greater detail with a discussion of exemplary embodiments and with reference to the accompanying drawing figures, of which FIG. 1a shows a side view of a first generic device according of the present invention, FIG. 1b a plan view of a first embodiment of the device in FIG. 1a.

FIG. 1c a plan view of a second embodiment of the device in FIG. 1a,

FIG. 2 a plan view of a third embodiment of the device in FIG. 1a,

FIG. 3 a plan view of a fourth embodiment of the device in FIG. 1a,

DETAILED DESCRIPTION OF THE PREFERRED EMBODIMENTS

Before a closer description and discussion of examples of embodiments of the device according to the present invention are given, a short exposition of the general background of the invention will be presented.

As thin-film based active circuitry employing inorganics, oligomers or polymers enters the mainstream of commercial electronics, it is expected that stacked devices with "smart"

layers, i.e. layers that possess individual processing capabilities, shall become ubiquitous. In addition to enhancing the possibilities inherent in the stacking concept, this implies that bus-type edge connections may carry messages that are distributed globally across the stack and picked up selectively by those layers they are intended for. On the other hand, the interconnect concepts of the present invention may involve stacks that contain sheets or layers without decoding circuitry, in which case dedicated edge connections to those sheets may have to be provided. An extreme case of the latter is where all layers are "dumb" and where each layer has dedicated electrical connections to driving circuitry on a supporting substrate or circuitry at a cable-connected location elsewhere. In what follows, these different aspects of possible electronic capabilities in individual layers shall not be treated in any further detail, since the appropriate choices of solutions according to the present invention will be obvious to a person skilled in the art.

Now a more specific description of generic devices according to the present invention, examples of embodiments thereof as well as a exposition of fabrication steps in preferred embodiments of the method according to the invention shall be given, such that these can be used for realizing embodiments of the device according to the invention.

Figure 1A:
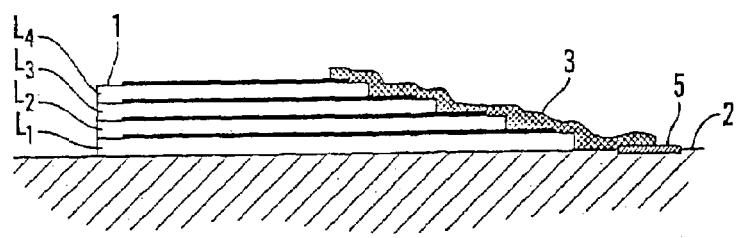

Specifically FIG. 1a shows a side view of a first generic device according to the invention. This generic device can be denoted as a step pyramid structure. It comprises stacked functional units which are provided on separate, but mutually adjacent sheet-like or film-like layers provided on a substrate. Circuits on the top surface of a given layer are electrically connected with contact pads on an exposed edge area of the layer. In the side view in FIG. 1 there are shown four such layers $L_1$–$L_4$ which together forms a stack 1. As shown in the side view the layers $L_1$–$L_4$ on the right side form a staggered structure and above this an electrical edge connection 3 is provided and extends from the top surface of the layer $L_4$ and down to a contact pad 5 on the substrate 2. The electrical edge connection 3 contacts and is connected with electrical conductors provided on the top surface of each layer L and indicated by a thicker, not specifically denoted line, such this is apparent from FIG. 1a.

Figure 1B:
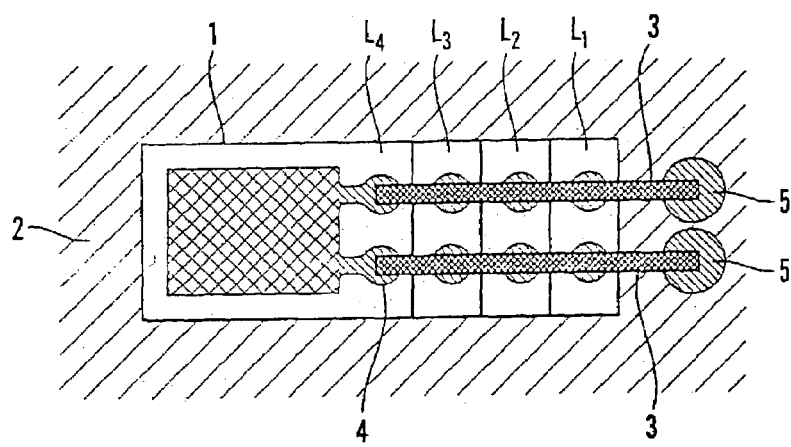

FIG. 1b shows a first embodiment of the device in FIG. 1a and it will here be seen that the layers $L_1$–$L_4$ in the stack 1 is staggered in one direction, namely towards the right. On each of the layers $L_1$–$L_4$ there are then provided contact pads 4, one of which is emphasized in the figure, and an electrical edge connection 3 is now provided such that it contacts the contact pads 4 and then connects the layers $L_1$–$L_4$ electrically to contact pads 5 on the substrate 2. The contact pads in the layers $L_1$–$L_3$ are provided in an exposed portion thereof which form the steps in the staggered structure. In FIG. 1b there is in the top layer shown a rectangular hatched area which represent a circuit area. Without this being shown in detail, the circuit area can consist of physically separate components and networks or circuits connected in one or more networks, and in case of the embodiments in FIG. 1b, two connecting paths 3 to the substrate are shown. It is of course to be understood that both in FIG. 1b and the additional figures theis hatched area in the top layer will have its equivalent in corresponding circuit areas in the other underlying layers.

Figure 1C:
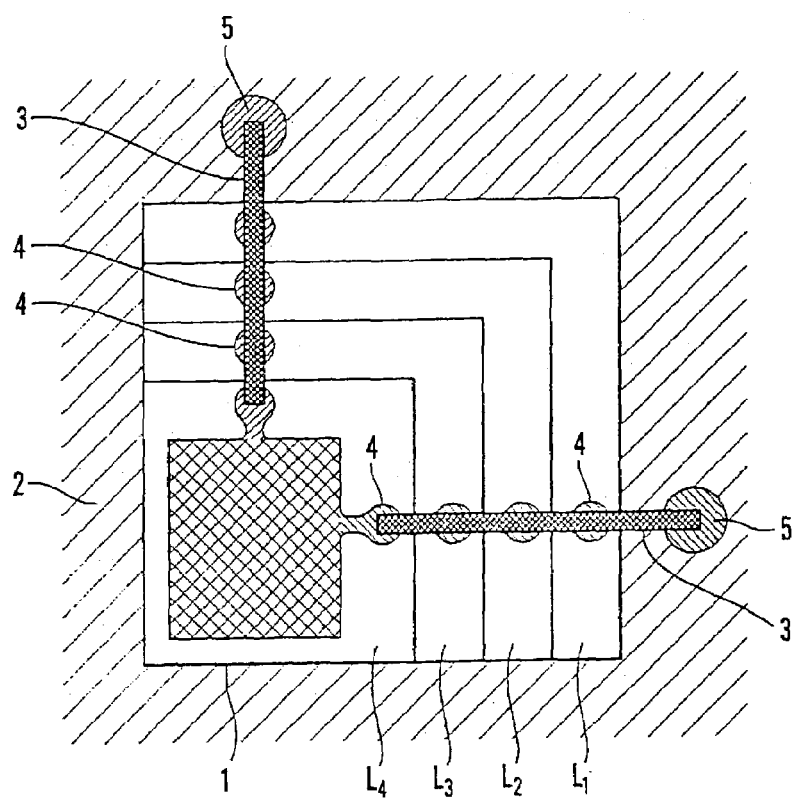

In FIG. 1c there is shown a plan view of another embodiment of the device in FIG. 1e where the stack 1 with the layers $L_1$–$L_4$ now is staggered in two mutually orthogonal directions, providing a much greater exposed step area which can be used for connecting purposes. This embodiment also allows alternative and more dispersed locations of the contact pads 4, the exposed portions as well as the contact pads 5 on the substrate. Simultaneously there is achieved good separation between the two edge connections 3 which contact the contact pads 4 in all layers and additionally the contact pads 5 on the substrate, as the edge connections are provided in each of the two stagger directions.

Figure 2:
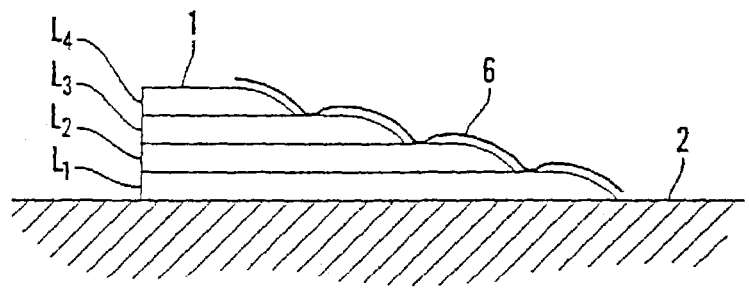

FIG. 2 shows a third embodiment of the device in FIG. 1a, but as will be seen, the edges to the separate layers $L_1$–$L_4$ in the stack 1 are here rounded in the step area and this may offer advantages when the edge connection which here is denoted 6, shall be carried over the steps formed by all layers and down to the substrate 2. If the step is not perpendicular, but rounded, the embodiment in FIG. 2 shall reduce the risk for a rupture in the electrical edge connection. When it is carried over a sharp edge, such as is the case in the embodiments in FIGS. 1a–c, there will always be a certain danger for a rupture arising in an edge connection formed as a deposited thin conducting layer. In a variant of the embodiment in FIG. 2 the steps need not be rounded, but can be formed with a gradual slope between the separate steps.

Figure 3:
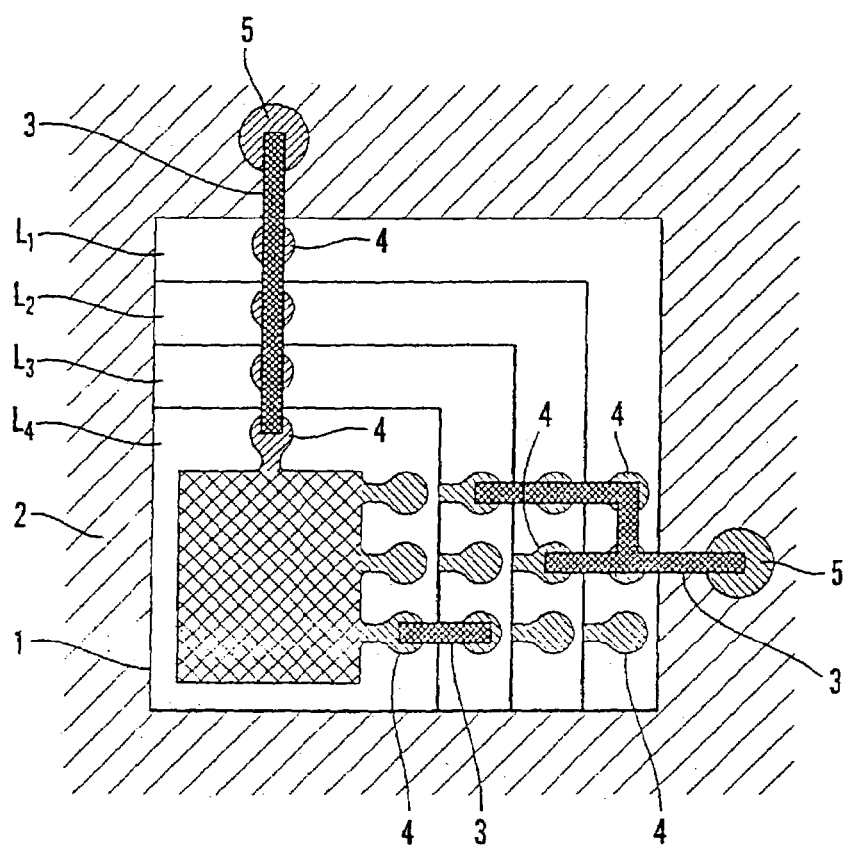

FIG. 3 shows a fourth embodiment of the device in FIG. 1a and wholly in analogy with the embodiment in FIG. 1c. Also here the stack 1 comprises four layers $L_1$–$L_4$ provided on a substrate 2 which correspondingly to the embodiment in FIG. 1c are provided with two contact pads 5. However, only one of the edge connections 3 is provided as a continuous connection from the uppermost layer $L_4$ and to the contact pad 5 on the substrate and simultaneously contacting all contact pads 4 on the exposed portions, i.e. the steps in the layers $L_1$–$L_4$ as shown. There are also provided several contact pads 4 on each of the steps in the layers as shown at the lower right in the stacked structure 1. Here it is e.g. provided three contact pads 4 on each step and this offers possibilities for independent connections between two or more layers mutually over a short edge connection 3 as shown and additionally possibilities for patching of electrical connections both between separate layers and mutually within a layer as shown for the layer $L_1$, possibly with additional further edge connection 3 to the contact pad 5 on the substrate 2.

It is to be understood that according to the present invention it will also be possible to form the stack 1 as a polygonal pyramid with 3,4,5 etc. stagger directions, but it will be obvious to persons skilled in the art that this is only a direct extension of the principle of the embodiments as exhibited in FIGS. 1b and 1c and hence they shall not be more closely described here.

Figure 4A:
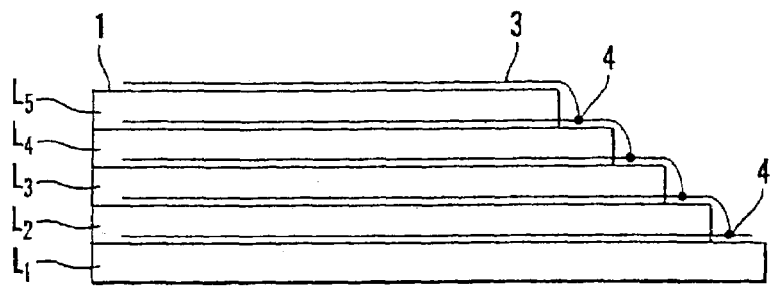
FIGS. 4a–c analog embodiments of the device in FIG. 1a without use of substrate, FIG. 4d a side view of a variant of the embodiments in FIG. 4a, but with possibility of accessing from both sides, FIGS. 5a–e a first example of fabrication steps for forming a device of the kind shown in FIG. 1a, FIGS. 6a–d a second example of fabrication steps for forming a device of the kind shown in FIG. 1a, FIG. 7 a side view of a second generic device according to the present invention, FIGS. 8a–g an example of fabrication steps for forming a device of the kind shown in FIG. 7, FIG. 9a geometric relationships in the patterning of electrical edge connection on to the device in FIG. 1a, FIG. 9b geometric relationships in the patterning of electrical edge connections on the device in FIG. 7, FIG. 10 schematically the layout of the electrodes in a passive matrix-addressable device according to prior art, and FIG. 11a–m examples of fabrication steps for forming a stacked matrix-addressable memory device based on the device according to the present invention.
Figure 4B:
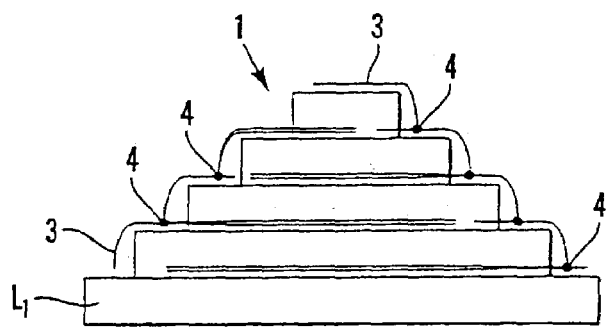
Figure 4C:
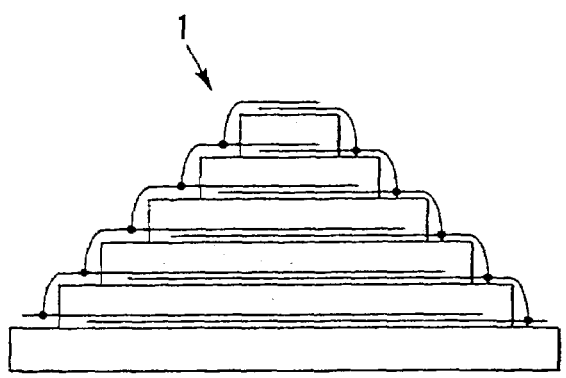

FIGS. 4a–c show embodiments of the first generic device according to the present invention with the electrical edge connections 3 schematically indicated as lines between and above the layers. It is distinguished above the one in FIG. 1a in that stack 1 is not provided on a substrate, but that the layers L are self-supporting structures. FIG. 4a hence shows in side view an analog embodiment to that in FIG. 1a, but without substrate. The stack 1 comprises 5 self-supporting layers $L_1$–$L_5$ and there is on every step in the stack provided contact pads 4 and for each of the layers $L_1$–$L_4$ an edge connection 3 connected with the contact pads 4. FIG. 4b shows a self-supporting device embodied as either a regular step pyramid or alternatively as a polygonal step pyramid. At right the edge connection 3 via the contact pads 4 on the layers $L_1$–$L_4$ forms a continuous connection between all layers from $L_1$ to $L_5$ with the use of several current paths as well as patching as indicated in FIG. 4b at the left where it will be seen that contact pads 4 only are provided on the exposed portions of $L_2$ and $L_3$. In this manner it is easy to form an electrical connection between two or more of the layers in the stack 1 and these need not be adjacent. Correspondingly FIG. 4c again shows the stack 1 as a step pyramid structure, but with edge connection 3 in at least two stagger directions. In FIG. 4 the edge connection here is provided diametrically opposite on each side and contact pads 4 are provided on each step of the structure as here shown with 6 layers $L_1$–$L_6$.

Figure 4D:
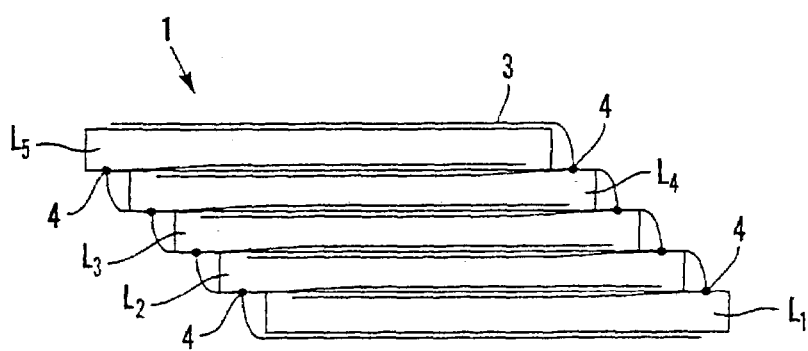

The first generic device according to the invention can in addition particularly be realized with the possibility for two-sided contacting, as this is shown in FIG. 4d. In order to form separated step areas which expose both surfaces of each of the five layers $L_1$–$L_5$, these which very well may have the same extension, are stepwise mutually staggered. Hence both surfaces of each layer L with edge connections 3 and contact pads 4 on each of the steps, i.e. the exposed portions of the layers are contacting, as these portions on one side of the step form an inverted step structure in relation to the corresponding portions of the opposite side and hence admit access to the opposite surface of each layer L. Beyond that, the layout of the edge connections 3 and the contact pads 4 are the same on both sides of the device as shown in FIG. 4d.

Generally the edge connections 3 in the embodiments shown in FIGS. 1–4 could be formed in each separate layer by using the edge areas specifically for contact purposes, the edge area being formed in an exposed portion of each layer in the stack 1 and these exposed portions being formed by realizing the stack as a staggered structure with staggering in one or more directions, as mentioned above. The steps will, of course, be exposed when the contacts are made.

Generally each layer L in the stack 1 itself can also be formed as a sandwich of the sublayers which may comprise electrical conductors, active circuits and functional materials, e.g. memory materials for data storage purposes. When each layer is built as a sandwich of such sublayers, preferably in thin-film technology, separate sublayers can be realized with specific functional purposes, e.g. in order to achieve contacting and conducting functions or they may comprise active circuits, e.g. formed in thin-film technology or wholly consisting of functional materials, e.g. memory materials for data storage purposes. Without entering into details, it will be evident for persons skilled in the art that each separate layer can be fabricated on a supporting film before it is mounted in the stack or it can be formed by a deposition process or a series of such on a surface of the stack itself. In each case must each sublayer then have a thickness, the lower limit of which will be given by the carrying capacity of the supporting layer in relation to the forces it is exposed to during the prefabrication and stack addition processes. By using additive processes the thickness of single layers can be made much smaller, as the sublayers basically could be deposited as monolayers.

There shall now be given a more detailed description of how the edge connections expediently can be realized in the device according to the invention. In the embodiments as specifically shown in FIGS. 1–3 the edge connection can be formed by a single electrode deposition or a sequence of deposition operations, such this shall be mentioned in more detail below. In the latter case each deposition operation implies that only a smaller part of the total edge height shall be negotiated, i.e. a single step in the edge structure, and the continuity of the edge connection over a plurality of steps will then be obtained by the sequentially deposited electrodes overlapping.

Techniques for forming edge connections with high precision include lithographic methods based on wet etching or dry etching as well as particle milling, high precision stamping such as soft lithography, and electrolysis. Common to most of these techniques which provide high solution is limited depth of field which in its turn limits the height of each separate step or the number of steps which can be connected electrically in a single production step. In such cases a simple application of a common conductor which e.g. forms a power supply line, bus line etc. can be employed.

Figure 5A:
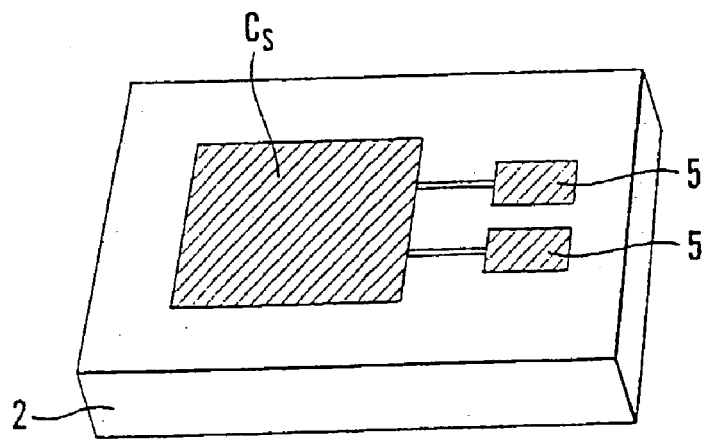
Figure 5B:
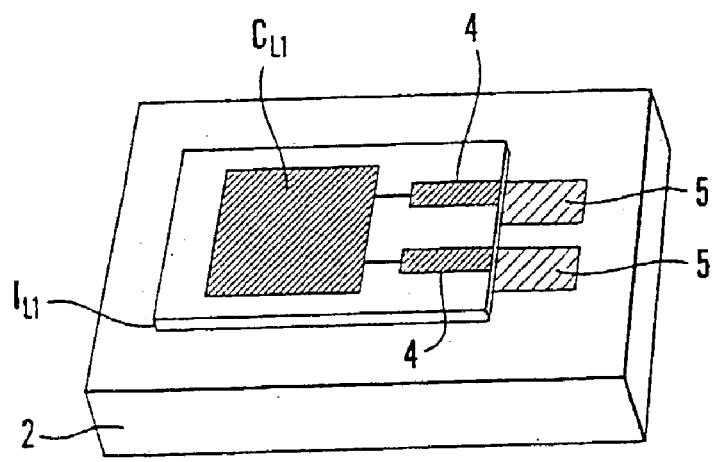
Figure 5C:
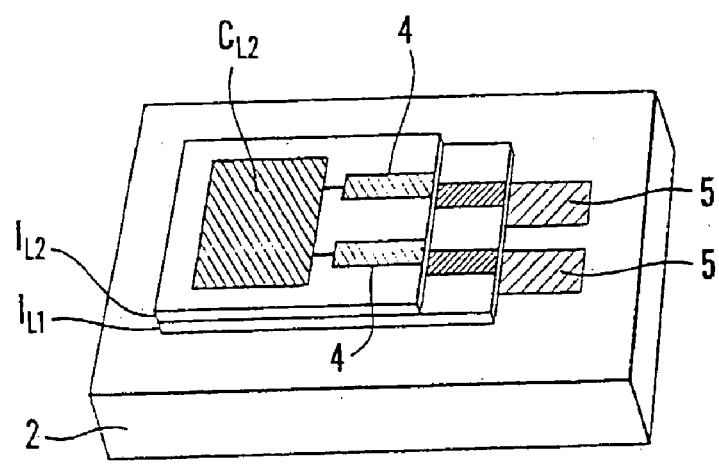
Figure 5D:
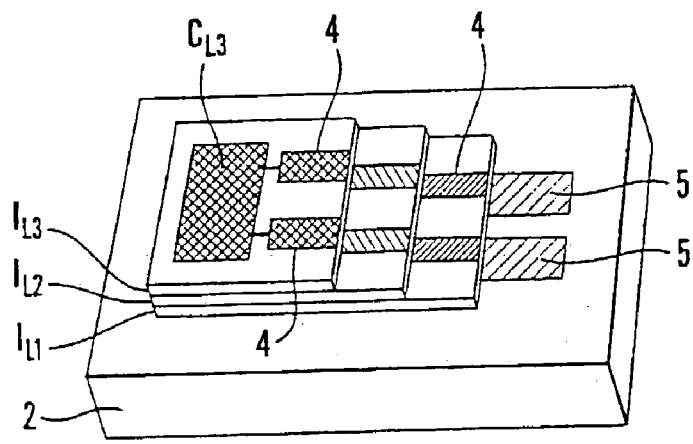
Figure 5E:
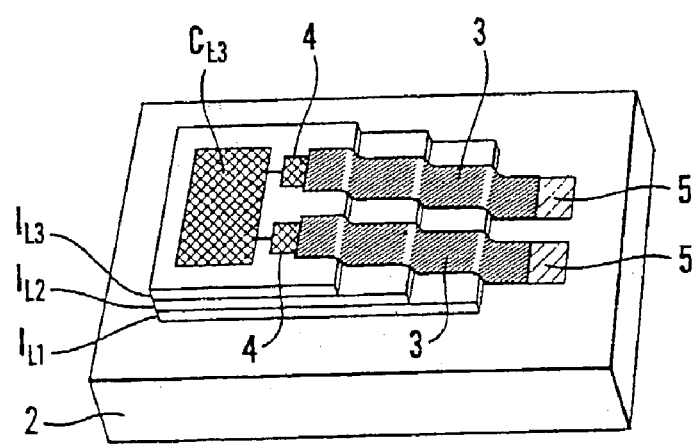

FIGS. 5a–e show a first example of fabrication steps for generating edge connections in the stack which forms the device according to the invention. Specifically FIG. 5a shows the substrate 2 before the deposition of the layers L which form the stack 1 itself. A circuit area $C_s$ is provided in or on the substrate 2 and can in itself form a circuit and this circuit area is further connected with contact pads 5 of the substrate. In the next fabrication step shown in FIG. 5b an isolation layer $I_{L1}$ is provided and the denomination thereof shows that it is connected with the first layer $L_1$ in the stack. For the isolation layer $I_{L1}$ now a circuit area $C_{L1}$ is provided for the layer $L_1$ and connected with contact pads 4 provided on the isolation layer $I_{L1}$. FIG. 5c renders the same fabrication step for the layer $L_2$, here with an isolation layer $I_{L2}$ which is provided and laid out such that the resulting layers $L_1$ and $L_2$ now shall form a staggered structure. Also on the isolation layer $I_{L2}$ there is provided a circuit area $C_{L2}$ and contact pads 4 connected with this circuit area. FIG. 5d then shows the deposition of a third isolation layer $I_{L3}$ for the third layer $L_3$ in the stack and with a corresponding circuit area $C_{L3}$ and contact pads 4 connected therewith. The example shown in FIGS. 5a–5d illustrate how layers $L_1$–$L_3$ are formed consisting of respective isolation layers $I_{L1}$–$I_{L3}$ and circuit areas $C_{L1}$–$C_{L3}$ connected with respective contact pads 4. In a final fabrication step continuous current paths or conductive paths 3 are provided and form the edge connections which now connect all contact pads 4 mutually in each of the layers and with the contact pads 5 on the substrate.

Instead of depositing the edge connections 3 in one single operation, they can as mentioned also be deposited stepwise such this shall be discussed with reference to FIG. 6, which in regard of the separate layers and sublayers shows these formed correspondingly to those in FIG. 5, but otherwise illustrates stepwise deposition of the edge connections 3.

Figure 6A:
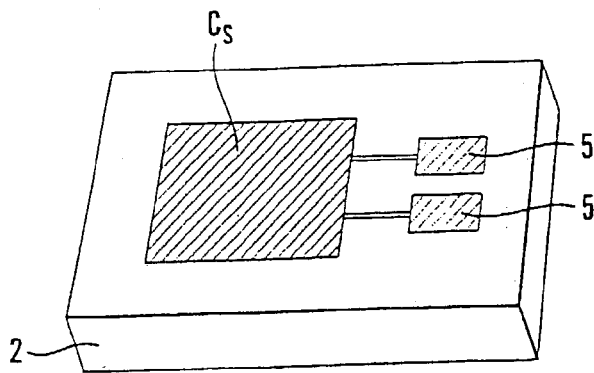
Figure 6B:
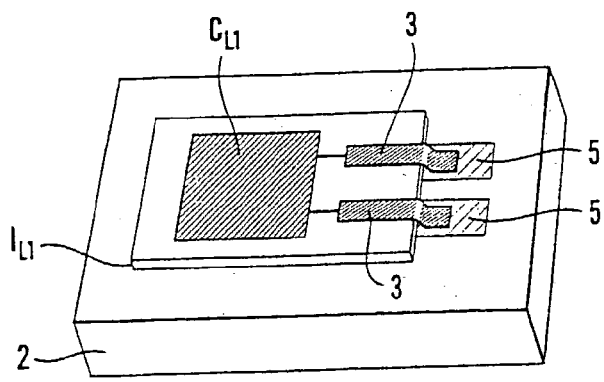
Figure 6C:
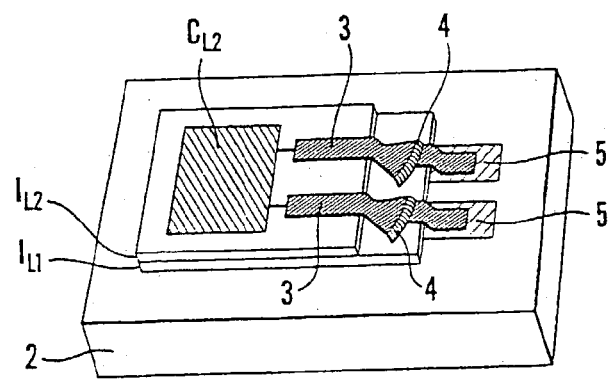
Figure 6D:
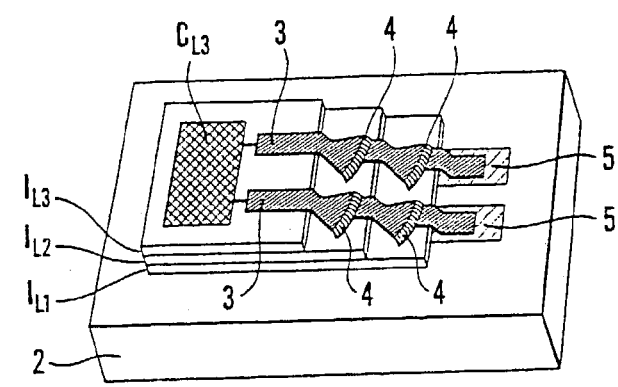

FIG. 6a shows a substrate 2 with a circuit area $C_S$ and contact pads 5, while FIG. 6b shows a substrate 2 with a provided isolation layer $I_{L1}$ and circuit area $C_{L1}$ for a first layer $L_1$ in the stack. There are now deposited edge connections 3 over the edge on the isolation layer $I_{L1}$, these edge connections creating contact between the circuit area $C_{L1}$ and the contact pads 5 on the substrate 2. In FIG. 6c another isolating layer $I_{L2}$ is deposited with a circuit area $C_{L2}$ as well as edge connections 3 which are carried over the edge of the isolation layer $I_{L2}$ and down to the edge connection 3 on the underlying isolation layer $I_{L1}$ such that contact pads 4 are formed on the edge connections 3 deposited in FIG. 6b. The process is repeated in FIG. 6d for a third layer $L_3$ with isolation layer $I_{L3}$, circuit area $C_{L3}$ and further edge connections 3 with contact pads 4. This results in that the embodiment as shown in FIG. 6d realizes a contiguous, but stepwise deposited edge connection 3 from the uppermost layer in the stack and over contact pads 4 in the interlaying layers and down to the contact pads 5 in the substrate. This also implies that the deposition and contacting operation for each edge connection 3 in itself is handled stepwise and repeatedly and hence any desired height of the stack can be negotiated. The field of depth which is obtained with deposition processes based on photolithographic technique hence only needs to be adapted to an actual step height and in principle the height of the separate step can then precisely correspond to the actual and limited depth of field which is obtained with high resolution photolithography for fabrication of edge connections 3.

In FIG. 7 there is shown another generic device according to the present invention. This one is also embodied as a kind of step pyramid, but turned upside down and could hence be called an inverted step pyramid. Similar to the device in FIG. 1 the device in FIG. 7 also consists of layers $L_1$–$L_4$ which form a stack 1 of functional units in the device. The stack 1 with the layers L provided on the substrate 2 and the concept "inverted step pyramid" is based on the fact that it is the first layer $L_1$ in the stack 1 which has the smallest area, but the area of each layer increases with the distance from the substrate. A layer which is overlying another is extending beyond this and above the edge of the underlying layers, such each separate layer L in the stack 1 obtains a portion resting directly against the substrate 2. For each of the layers L there are on the substrate provided one or more contact pads 5 such this is shown in FIG. 7, and these contact in each of the layers L edge connections 3 which connect circuit areas of functional units in these layers with the substrate. The edge connections 3 are carried over the edges of the steps formed in the separate layers L and down to the substrate 2. In the device in FIG. 7 it is achieved that e.g. the separate layers have direct electrical connection to e.g. driver and control circuits provided in the substrate 2, such this can be case if the substrate is formed of a silicon chip.

Figure 8A:
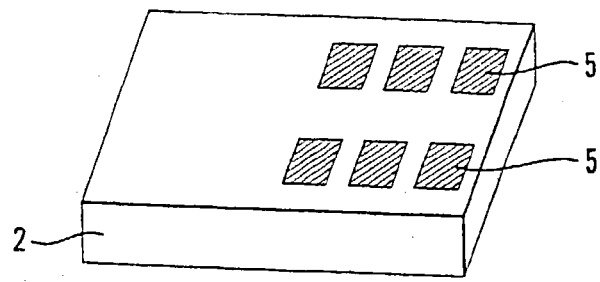
Figure 8B:
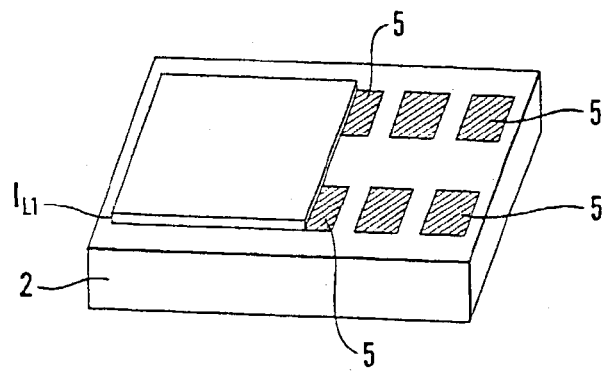
Figure 8C:
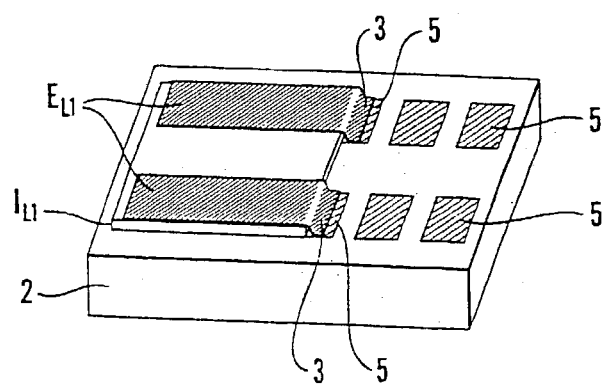
Figure 8D:
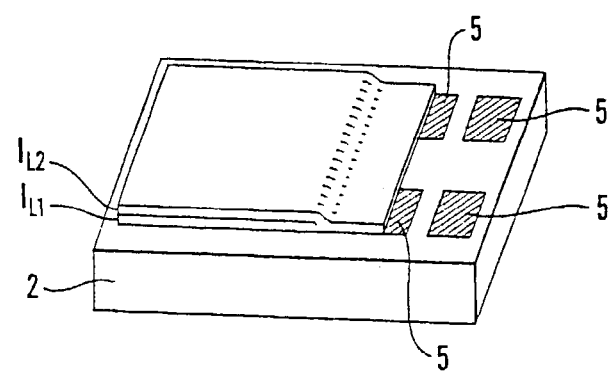
Figure 8E:
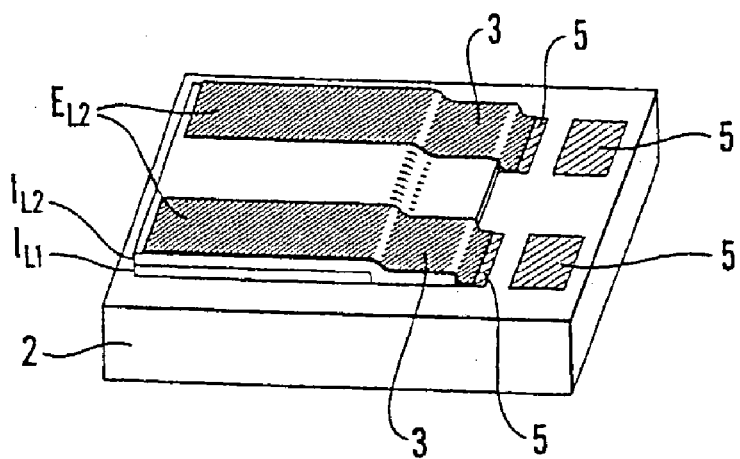
Figure 8F:
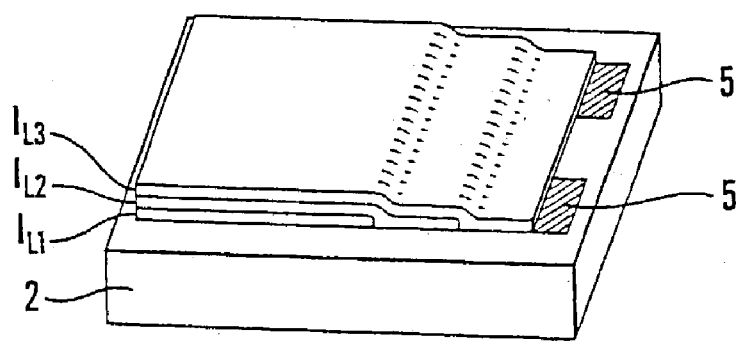
Figure 8G:
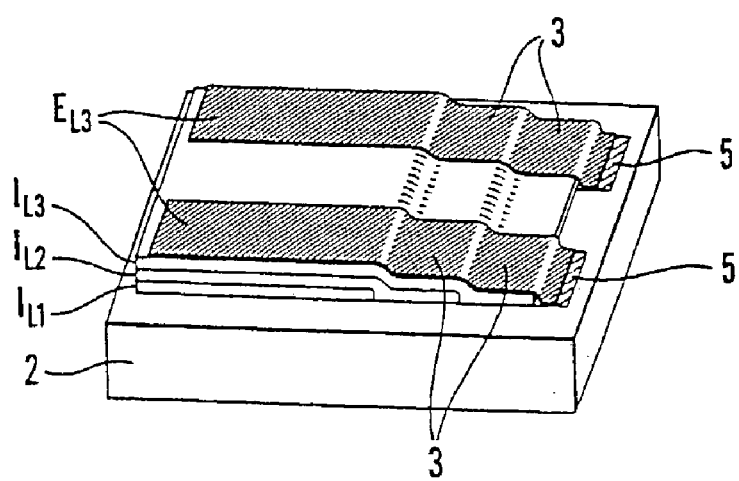

Now an example shall be given on how a stack 1 which forms an inverted step pyramid as shown in FIG. 7 can be fabricated. In FIG. 8a a substrate 2 is shown with contact pads 5. A first isolation layer $I_{L1}$ is provided over a substrate 2 such this is shown in FIG. 8b and provided as herein shown with two electrodes $E_{L1}$ which via the edge connections 3 are connected with contact pads 5 on the substrate 2 such as rendered in FIG. 8c. It is to be understood that there on the isolating layers $I_1$ can be formed circuit areas and not in detail shown functional units which via the electrodes $E_{L1}$ are contacted to an underlying layer. FIG. 8d now shows how the next layer is formed by providing an isolation layer $I_{L2}$ over the first isolating layer $I_{L1}$, but extending beyond the latter and forming a step over the edge and down to the substrate where a portion of the layer $I_{L2}$ at least extends all the way to contact pads 5 on the substrate. Again electrodes $E_{L2}$ as shown in FIG. 8 are provided for connecting circuit areas and functional units in the second layer with the substrate via contact over an edge connection 3 and down to the contact pads 5 in the substrate. FIG. 8f shows how the process is repeated with deposition of yet another isolating layer $I_{L3}$ which masks the electrodes $E_{L2}$ and as shown in FIG. 8g is provided with an electrode set $E_{L3}$ which contacts the contact pads 5 on the substrate 2. Hence a stack as shown in FIGS. 8a–g is obtained with three stacked layers, but which in contrast to the device in FIG. 1a is provided as an inverted step pyramid, i.e. the area of each layer increases with its distance in the stack from the substrate 2. It will be seen that the device in FIG. 7 realized as shown in FIGS. 8a–8g provides separate access between the substrate 2 and the overlying layer L in the stacked structure 1. In this manner the method as illustrated by FIGS. 8a–8g contrasts with the methods as shown in FIGS. 5 and 6.

By using photolithographic technique for patterning electrodes, current paths, edge connections etc. in a stack, a relatively small depth of field may entail that there at most can be patterned a few steps at a time and if the number of layers in the stack is large, this implies that a photolithographic operation must be repeated a number of times, something which makes the fabrication of the device both more complicated and additionally increases the cost in no small degree. In order to avoid that the number of operations increases with the number of stacked layers and the number of steps in the stack, an alternative method for photolithographic patterning of contacts and current paths can be used such that the outcome is only one single operation for each layer, while all steps in the stack can be negotiated. This is shown in FIG. 9a for the device on FIG. 1a. Here the stack 1 which is not shown provided on a substrate, is staggered on the side such that the slope becomes linear. The necessary depth of field hence will be less and approximately equal to the largest height $h_{MAX}$ of one of the layers L in the stack 1. Neither is it necessary that all layers in the stack has the same step height, cf. that in FIG. 9a the layer $L_2$ has a much smaller height than the other layers. The required depth of field as shown by the distance between the parallel stitched sloping lines to the right extends over the whole height of the stack. Optimally the ray direction can be orthogonal to the slope line of the steps. A corresponding situation such it will be for the device shown in FIG. 7 is shown in FIG. 9b and it will again be seen that the necessary depth of field will be less or equal to h, where h is the height of one of the steps $L_1$–$L_4$ in stack, which here is located on a substrate provided with contact pads 5. Again the edge connections can be patterned from top to bottom in one single photolitographic operation, e.g. by letting the ray direction be orthogonal on the slope line as shown by the stitched lines in the figures.

Figure 10:
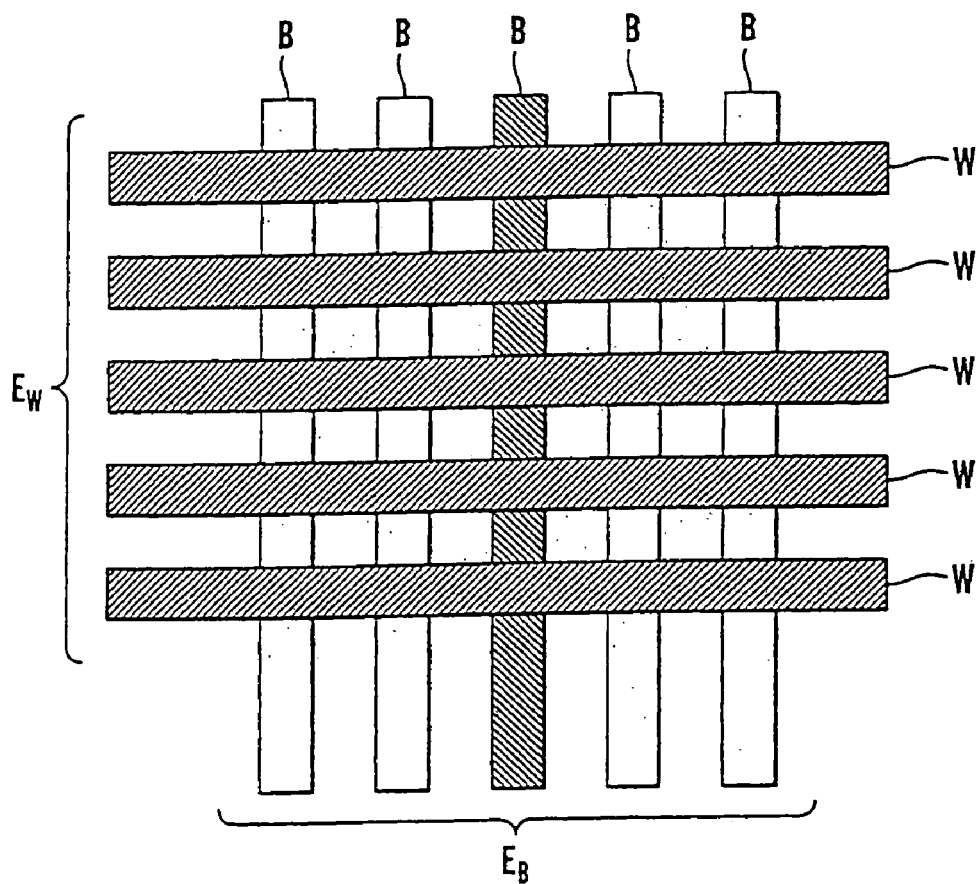

Each separate layer L in the device in FIG. 1a or in FIG. 7 can be realized as a passive matrix-addressable device such as shown in FIG. 10. It comprises a first set of electrodes $E_W$ comprising mutually parallel stripe electrodes W and another set of electrodes $E_B$ which likewise comprises mutually stripe electrodes B, but provided orthogonally to the electrodes W in the electrode set $E_n$. A functional material, e.g. a memory medium or a light-emitting medium, can now be provided in sandwich with respectively the electrode set $E_B$ and $E_W$. An architecture as shown in FIG. 10 can be used for realizing a passive matrix-addressable ferroelectric memory device, where the memory medium then in case of a ferroelectric memory material, e.g. an inorganic or organic material, and in the latter case especially preferred a polymer or copolymer. The separate memory cells in a memory of this kind will be formed in the crossing point between the electrodes W which realizes word lines and electrodes B which realizes bit lines in the memory device. If the electrode arrangement is used in a display where the electrodes in at least one set of electrodes will be realized in transparent material, correspondingly the pixels could be formed in the light-emitting material provided in sandwich between the electrode sets $E_W$,$E_B$ and in the crossing points between the electrodes in the respective sets. In a memory device of the kind mentioned a given memory cell can be written, read and erased by activating the word line electrodes W and the bit line electrodes B which cross at this cell. In FIG. 10 all word lines $W_B$ could for instance be activated and hence address all cells at the crossings with the hatched bit line electrode B as shown. A memory matrix which comprises a layer of memory material in sandwich between word and bit lines in an arrangement as shown in FIG. 10 can comprise several hundred or thousands of electrodes in each direction and extend laterally over macroscopic distances (millimetres to centimetres). The thickness of each separate layer, i.e. composed of layers which form electrode layers and memory medium, will be of a magnitude of 1 µm or less. Such matrices can be stacked and form the stack in a device according to the invention and it is then obtained a monolithic structure where each single layer which forms a matrix is isolated electrically against crosstalk and interference from the other layers in the stack, such that an extremely high volumetric memory cell density is obtained.

In a high density stack of large passive matrices the number of lines in the device which are connected with suitable driver and control circuits will be very large. If the layers in the stack are completely passive with all circuits for switching, multiplexing, detection and processing located on or in a supporting substrate, can the number of direct electrical connections between individual layers in the stack and the substrate be comparable with the total number of matrix lines, i.e. word and bit lines in the device, and the problems connected with the fabrication of such devices hence will be of paramount importance.

There shall now be given a description of a preferred method for fabrication of a device according to the invention where the separate layers are matrix-addressable devices as discussed above and where the device according to the invention hence forms a stack thereof, such that for instance a volumetric matrix-addressable memory device is obtained. The method is shown step-by-step in FIGS. 11a–11m, but for the case of simplicity the number of word lines is limited to 2 and the number of bit lines to 3, such that each matrix-addressable device in each single layer becomes a 2–3 matrix, in other words with at most 6 addressable cells and with a stack limited to only three layers. By using the method steps as shown in FIGS. 11a–11m a densely stacked matrix of passive, matrix-addressable devices can be obtained, as the series of fabrication steps provides for obtaining an electric connectivity with high density to the substrate. In the example shown the word lines in the separate layers are connected with a common conductor, while a separate set of bit lines is provided for each layer. In the subsequent FIGS. 11a–11m $I_L$ denotes isolation layers, S substrate, $W_L$ word lines and $B_L$ bit lines, while index L respectively refers to layers $L_1$, $L_2$, $L_3$.

Figure 11A:
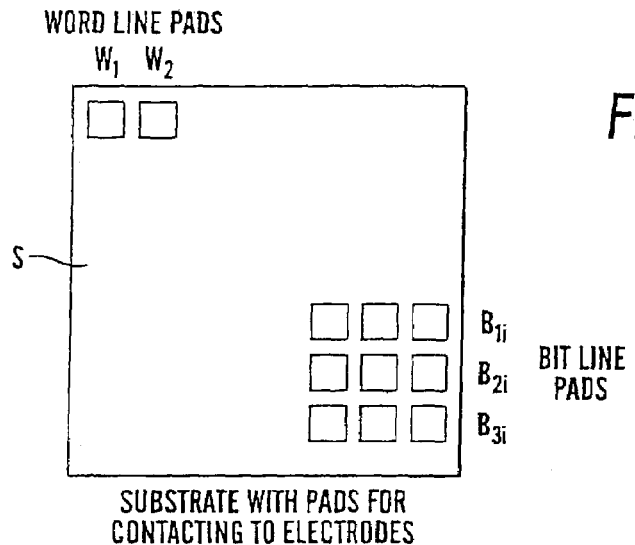
Figure 11B:
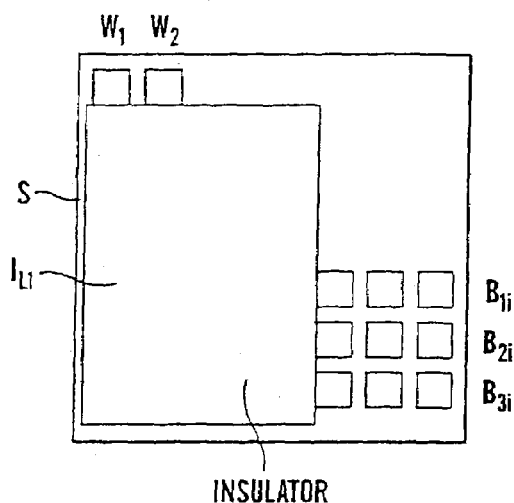
Figure 11C:
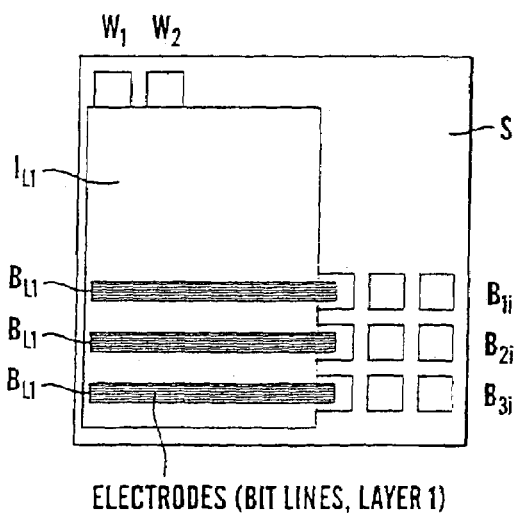
Figure 11D:
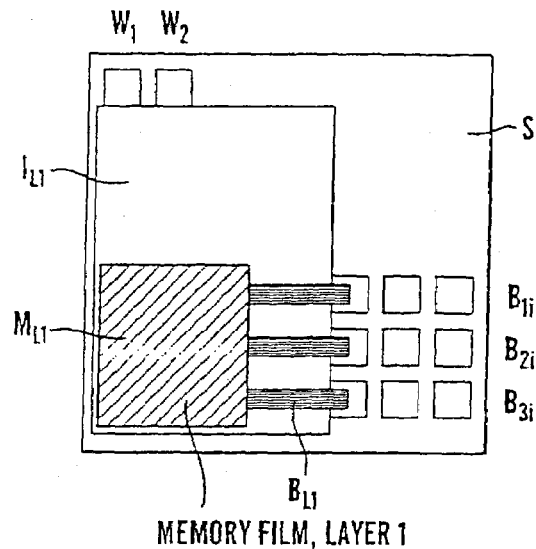
Figure 11E:
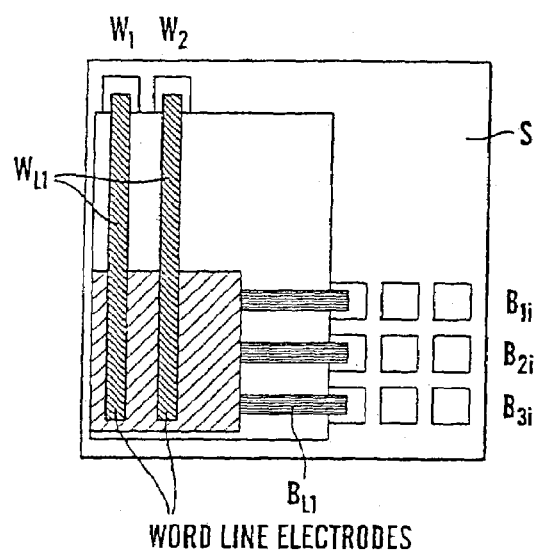
Figure 11F:
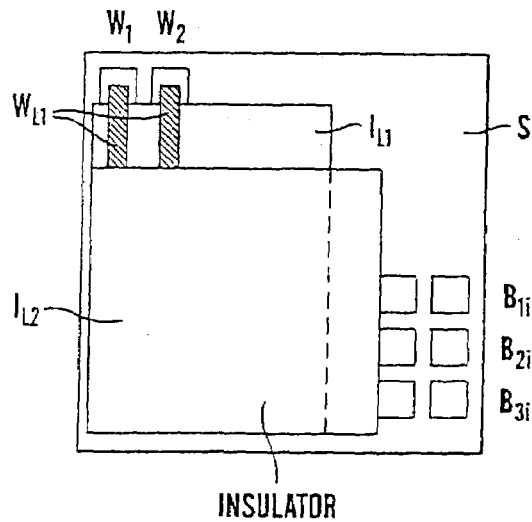
Figure 11G:
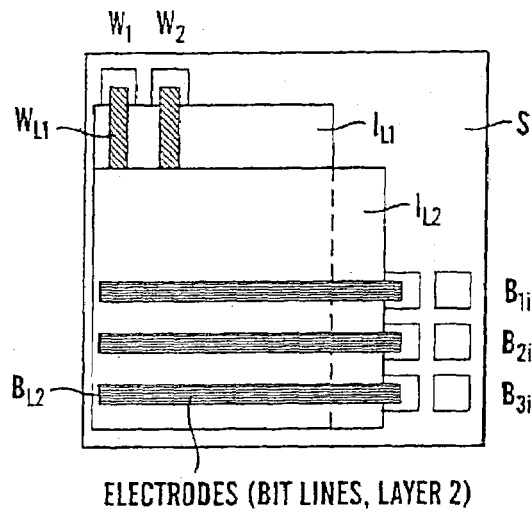
Figure 11H:
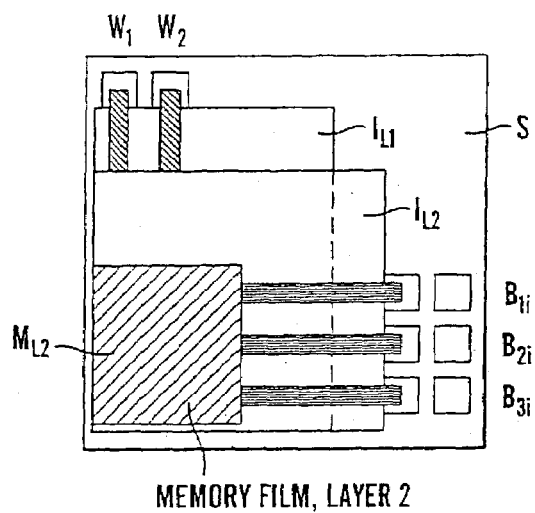
Figure 11I:
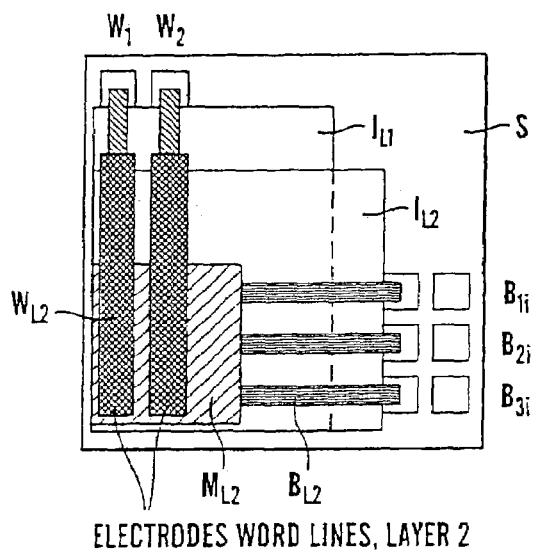

FIG. 11a shows the substrate S with respectively a bit line contact field with contact pads $B_1$–$B_3$ for respectively first to third bit lines in each layer and a word line contact field with only two contact pads $W_1$, $W_2$ for each of the word lines $W_L$ in all layers, but before the first layer in the stack has been deposited, FIG. 11b the substrate S with the first isolation layer $I_{L1}$ to protect against electric and chemical interference between the substrate S and the thereabove provided stack, and FIG. 11c how bit lines from the first layer, i.e. the first matrix-addressable device in the stack, are provided and connected with the first set of contact pads for the bit lines on the substrate S. In FIG. 11d a layer $M_{L1}$ of a functional material is shown provided, in this case a memory material, above the bit lines and which contacts these, while FIG. 11e shows how word lines $W_{L1}$ are connected with word line contacts in the substrate S. Another isolation layer $I_{L2}$ is in FIG. 11f shown provided over the first layer or the first memory device in the stack and is then provided with the bit lines $B_{L2}$ for the second layer, such this is shown in FIG. 11g. Thereabove again a memory layer $M_{L2}$ for the second layer is provided and contacts the bit lines $B_{L2}$, such this is apparent from FIG. 11h. FIG. 11i shows provided word lines $W_{L2}$. These contact the word line $W_{L1}$ such that common contacting for the word lines is obtained.

Figure 11J:
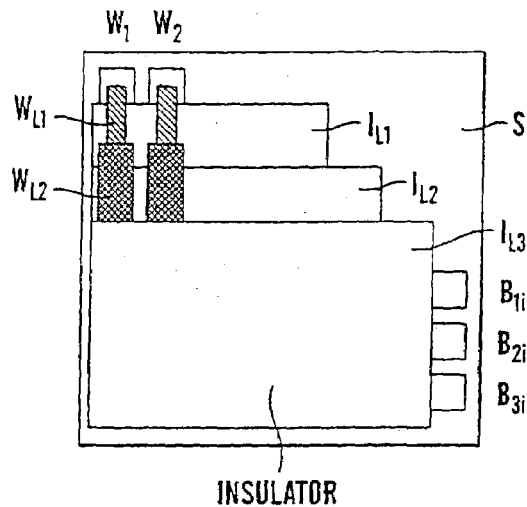
Figure 11K:
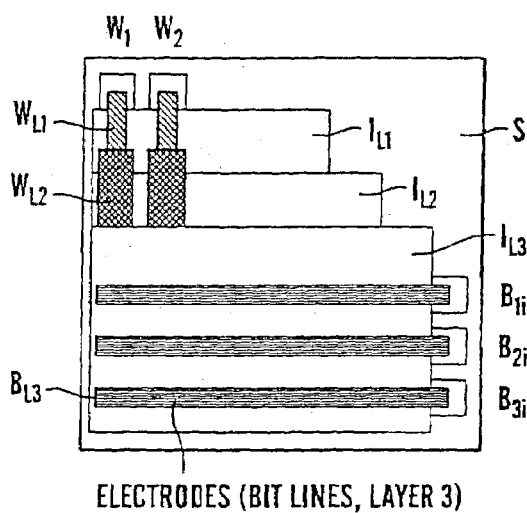
Figure 11L:
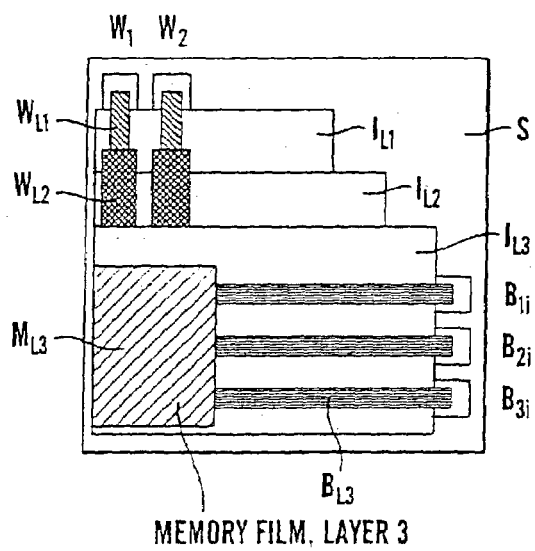
Figure 11M:
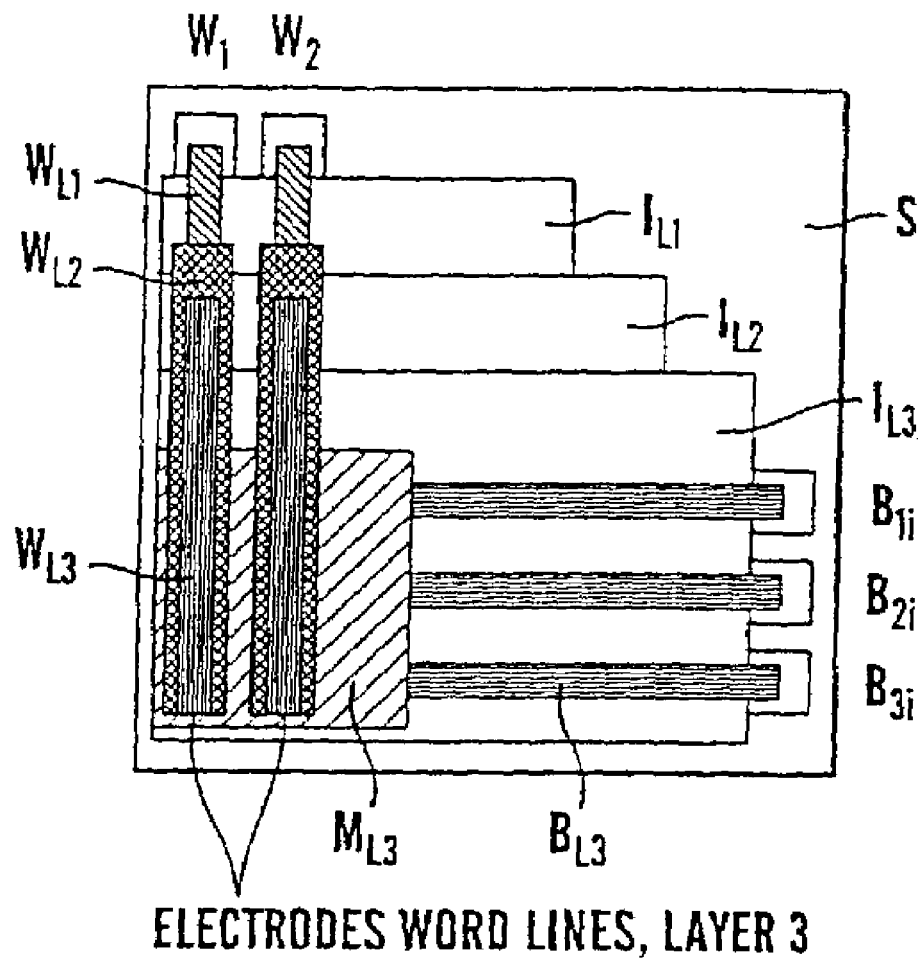

A new isolation layer $I_{L3}$ for the third layer is provided as shown in FIG. 11j and is provided with bit lines $B_{L3}$ as shown in FIG. 11k. FIG. 11l shows the memory layer $M_{L3}$ for the third layer deposited over $B_{L3}$ and it is as shown in FIG. 11m provided with word lines $W_{L3}$ which extends over the edge of each layer and forms edge connections to word lines $W_{L2}$ on the underlying layer.

The method steps as shown in FIGS. 11a–11m realizes a stacked passive matrix-addressable memory device which wholly corresponds to the device according to the invention. It shall of course, be understood that the limitation of word and bit lines in the example shown in FIGS. 11a–11m of course, do not correspond to the realities as a device according of the invention embodied as a passive matrix-addressable memory device very well may comprise a larger number of layers and at least up to several thousand word and bit lines in each layer. For instance it has turned out to be possible to realize two-dimensional memory devices as 8000×8000 matrices, i.e. with 64 000 000 matrix-addressable memory cells, and by stacking the number of cells, of course, will increase proportionally to the number of layers in the stack such that a volumetric device according to the invention with high storage capacity and high storage density is obtained.

In the separate layers as shown in FIGS. 11a–11m it can besides be possible to modify the fabrication, as in reality several procedures could be used. For instance could the word lines be formed in a single step by using a method in analogy with the step shown in FIGS. 5a–e and correspondingly will the provision of the bit lines, e.g. as shown in FIG. 11k, make it necessary that a larger number of layers must be negotiated in s single fabrication step. If this is a problem, a patterning alternative based on the geometry as shown in FIG. 9a can be used or the edge connections can be formed sequentially with patching to an underlying step in analogy with the fabrication steps shown in FIGS. 6a–d.

Even if it is possible to combine the principles in the present invention with through-going vias according to prior art, certain essential features shall be noted which qualitatively distinguishes the two.

In the present invention, vertical connectivity in the stack as well as intra-layer patching can be achieved in manufacturing operations after the layers in the stack have been laid down, providing increased flexibility in selecting manufacturing strategies (materials compatibility issues; customizing of devices, e.g. post stacking).

In the present invention, no etching, drilling or similar operation is required to open connecting channels through layers in the stack.

The present invention provides realistic routes towards large-scale manufacturing of stacked devices in low-cost, high-volume operations such as reel-to-reel production of polymer-based devices.

The invention claimed is:

1. A memory and/or data processing device comprising
at least two stacked layers forming a stack with each of the layers having a thickness of 1 µm or less, the stack either forming a self-supporting structure or being provided on a substrate, and the stack including at least one of the layers staggered in at least one direction such that steps in the staggered layers being formed by exposed portions of the separate layers in the stack and with a step height corresponding to a thickness of respective layers,
one or more contact pads provided on each step in the staggered layers in electrical connection with memory and/or processing circuits in the respective layer, and one or more electrical edge deposition connections provided on and extending over the step in direct contact with the step in each layer in the form of electrical conducting structures on the step and over and on an edge between the steps in each layer and deposited on a surface of the layers, the electrical edge connections contacting one or more contact pads in the layers and providing electrical connection between each layer and also between the layers and contact pads.

2. The memory and/or data processing device according to claim 1, wherein two or more contact pads in one or more layers are mutually connected by electrical conducting structures provided on the step in the respective layer.

3. The memory and/or data processing device according to claim 1, wherein the electrical edge connections are provided as continuous current paths between contact pads in at least three consecutive layers in the stack or between contact pads in at least two adjacent layers in the stack and the substrate adjacent to one of these layers.

4. The memory and/or data processing device according to claim 1, wherein the electrical edge connections are provided as a patched current path between two adjacent layers in the stack or between the substrate and the layer adjacent to the substrate.

5. The memory and/or data processing device according to claim 1, wherein the stack forms at least a part of a step pyramid structure, such that the layers have different areas.

6. The memory and/or data processing device according to claim 1, wherein the separate layers in the stack are mutually displaced, such that the staggered structure comprises at least one staggered portion where the steps form an exposed portion of an upper surface in the respective layers in the stack and at least one staggered portion where the steps form an exposed portion of a lower surface in the respective layers in the stack, one or more contact pads on each step in each case being electrically connected with conducting structures respectively provided on opposite surfaces of the layers.

7. The memory and/or data processing device according to claim 1, wherein a side edge of each layer between the steps is rounded or forms an inclined surface.

8. A memory and/or data processing device having at least two stacked layers provided in a stack, wherein the stack either forms a self-supporting structure or is provided on a substrate, and wherein the stack comprises at least one structure staggered in at least one direction, such that steps in the staggered structure are formed of the separate layers in the stack and with a step height corresponding to a thickness of respective layers, said memory and/or data processing device comprising one or more contact pads provided on each step in the staggered structure in electrical connection with memory and/or processing circuits in the respective layer, and one or more electrical edge connections provided on and over the step in each layer in the form of electrical conducting structures on the step and over an edge between the steps in each layer and deposited on a surface of the layers, the electrical edge connections contacting one or more contact pads in the layers and providing electrical connection between each layer and also between the layers and contact pads, the stack being provided on the substrate and the stack forming at least part of an inverted step structure, such that an area of each layer increases with a distance from the substrate, and overlying layers being carried over the edges of underlying layers and resting against the substrate, overlying layers being formed with one or more staggered portions, whereby the number of steps in the staggered portion of a layer corresponds to the number of layers located therebeneath.

9. The memory and/or data processing device according to claim 8, wherein one or more contact pads are provided in the substrate where the layers rest against the substrate.

* * * * *